(12) United States Patent
Yao et al.

(10) Patent No.: US 6,232,234 B1
(45) Date of Patent: May 15, 2001

(54) METHOD OF REDUCING IN FILM PARTICLE NUMBER IN SEMICONDUCTOR MANUFACTURE

(75) Inventors: Liang-Gi Yao, Taipei; Shih-Chieh Su; Hung-Chuan Chen, both of Hsinchu; Yuh-Min Lin, Kaohsiung, all of (TW)

(73) Assignees: Applied Materials, Inc., Santa Clara, CA (US); Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/275,730

(22) Filed: Mar. 24, 1999

(51) Int. Cl.$^7$ .................................................. H01L 21/302
(52) U.S. Cl. ............................................. 438/714; 438/9.5
(58) Field of Search .................................. 438/710, 714, 438/730, 905, 906

(56) References Cited

U.S. PATENT DOCUMENTS 5,854,138 * 12/1998 Roth et al. ............................ 438/714

* cited by examiner

*Primary Examiner*—David Nelms
*Assistant Examiner*—Quoc Hoang
(74) *Attorney, Agent, or Firm*—Christensen O'Connor Johnson Kindness PLLC

(57) ABSTRACT

A short period of low power plasma-activated process is imposed after film-forming to remove residual chemical compound. This method includes flowing one or more carrier gases with one or more reaction gases into the chamber, reducing plasma power to react the residual chemical compound with the reaction gases, and pumping to evacuate reaction product from the reaction chamber. The reduced plasma can be achieved by increasing gap spacing at a constant power or gradient power. Alternatively, it can be obtained by keeping the same spacing as the main process with a small power source.

20 Claims, 1 Drawing Sheet

METHOD OF REDUCING IN FILM PARTICLE NUMBER IN SEMICONDUCTOR MANUFACTURE

FILED OF THE INVENTION

The present invention relates to a semiconductor process, and in particular, to a method of reducing the amount of residual particles in a chamber after a film-forming reaction by using a low power plasma-activated reaction under vacuum conditions.

BACKGROUND OF THE INVENTION

With the rapid development of integrated circuit technologies, there has been a continuous drive to reduce the size of these circuits. Thus, semiconductor technologies have strived to increase the integrated circuit density on a chip. As the semiconductors are miniaturized and features become more closely spaced, the tolerance of process conditions become more critical because minute defects will cause circuits on these wafers to fail.

Chemical vapor deposition or physical vapor deposition are both popular methods of forming layers or "films" on a wafer. These techniques, and others, utilize reaction gases applied by a recipe for forming layers on the wafers. For example, low pressure chemical vapor deposition (LPCVD), plasma enhanced chemical vapor deposition (PECVD), or high density plasma chemical vapor deposition (HDPCVD) also need reaction gases to deposit a particular type of layer, for instance a silicon nitride layer. The reaction gases for forming the silicon nitride layer are $SiH_4$, $NH_3$, $N_2$, $N_2O$ or $SiH_2Cl_2$, $NH_3$, $N_2$, and $N_2O$. Further, a borophosphorsilicated glass (BPSG) layer can be formed by low-pressure chemical vapor deposition using tetraethylorthosilicate (TEOS) as a reactant. A silicon dioxide layer can be formed by a chemical vapor deposition process, using TEOS as a source at a temperature between about 650 to 750 degrees centigrade, at a pressure of about 1 to 10 torr. Other techniques used in semiconductor processing also generally require the presence of some gas in a chamber for certain purposes. For example, some thermal annealing processes utilize nitrogen gas. In addition, various carrier gases are utilized in a variety of reactions.

It is a particular issue, however, that residual reaction gases typically remain in the reaction chamber after the film-forming reactions have been completed. The pressure of residual reaction gases causes the the formation of particles in the film, which are referred to as in-film paticulates, due to continued reaction in the gas phase. These in-film particulates are increasingly problematic as semiconductor film patterns (line widths) are being reduced in size and lead to an increasing percentage of defective devices.

Typically, the reaction gases will be pumped out of (evacuated from) the chamber after a semiconductor process and this should reduce the potential number of particulates formed. Particularly, it is known that the in-film particle number can be reduced by pumping out residual gases in gaslines and from the reaction chamber after processing. However, it is also the case that some of the residual gas used in the film forming reaction will remain in the chamber and gas lines after the processing has been completed. It is also known that the residual gases in the reaction chamber itself are much more critical in affecting in-film particle numbers because the reaction chamber has a much higher temperature than anywhere else in the equipment and the chemical reaction rates usually increase with temperature. Thus, increasing the pumping speed after the process has been completed to evacuate the chamber more quickly is the usual method to remove residual gases and thereby minimize particulate formation. However, it is only somewhat effective. Further reduction in the in-film particle number is desired as line widths continue to decrease in order to reduce losses due to defects. This cannot currently be achieved by known techniques. What is required is a method to reduce the incidence of in-film particles and thereby improve semiconductor productivity.

SUMMARY OF THE INVENTION

The present invention generally provides a method and apparatus to reduce the incidence of in-film particles on semiconductor devices and thereby reduce the proportion of defective devices produced.

The invention is applicable in processes for forming thin films for integrated circuit fabrication using techniques involving chemical reagent gases. In such processes, a residue of chemicals will remain in the reaction chamber after the desired film-forming reaction. After film-forming is completed, then according to the invention, a short period of lowered power plasma-activated process is imposed in the presence of reaction gases, while simultaneously pumping to evacuate the reaction chamber, to remove residual chemical compound and thereby reduce the in-film particle number. The method of the invention includes flowing a carrier gas, such as one containing helium and nitrogen gases and reaction gases, such as $NH_3$ or $O_2$ or $N_2O$ into the chamber. Power to the plasma generator is slowly reduced to between about 5 to 50% of the power used for film forming, and preferably to between about 10 to about 20%, to promote reaction of any residual chemical compound in the chamber with the reaction gases. The chamber is also simultaneously and preferably continuously evacuated by pumping to remove the reacted residual chemical compound to prevent or minimize particle deposition.

The reduced power plasma can be achieved by several techniques including increasing gap spacing at a constant power or gradient power. Alternatively, it can be obtained by maintaining the same spacing as in the main film-forming process but with a smaller power source. In accordance with the invention, in-film particulates are reduced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying illustrative drawing, wherein:

The FIGURE is a flow chart of an embodiment of the present invention.

DETAILED DESCRIPTION OF THE PREFERRED EMBODIMENTS

Figure 1:
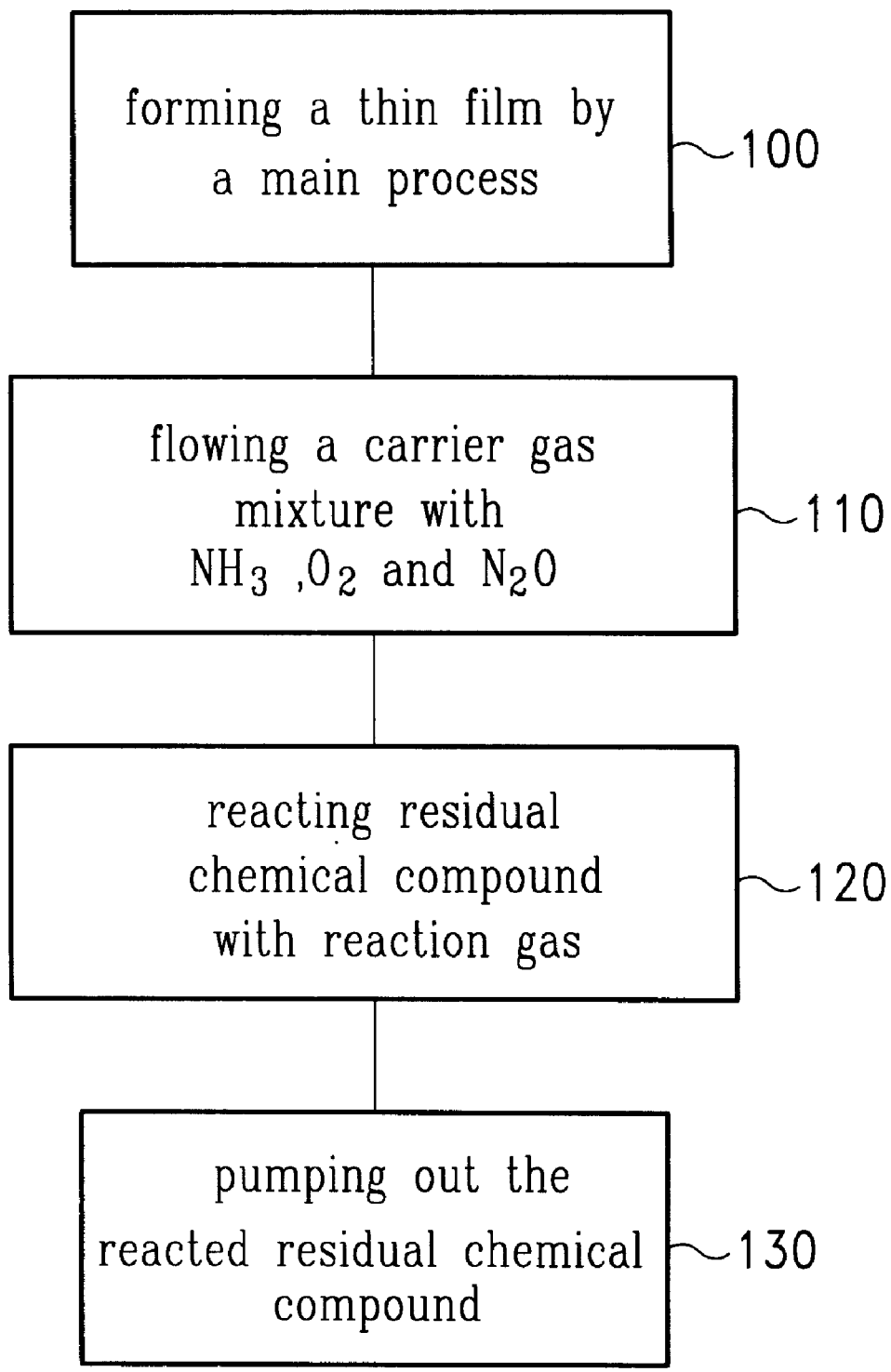

The present invention will be described in detail with reference to the illustrative FIGURE. The present invention provides a method to further reduce in-film particle number in semiconductor devices in the manufacturing process of these devices. The present invention includes generating a plasma under low power while evacuating the reaction chamber.

The FIGURE is a flow chart illustrating an embodiment of the present invention. In step 100, a main process forms a thin film for integrated circuits by using a conventional technique involving a chemical process or procedure, such as chemical vapor deposition (CVD). Alternatively, a CVD process may include use of a plasma, such as high density plasma CVD (HDP-CVD), plasma enhanced CVD (PECVD), or the like. The main film-forming process is generally any process used to deposit any thin film in semiconductor integrated circuit manufacture. For example, the main process may be a process for forming a nitride layer in a reaction chamber with a nitrogen based gas and carrier gases, such as $SiH_4$, $NH_3$, $N_2$, $N_2O$ $SiH_2Cl_2$, $NH_3$, $N_2$, $N_2O$. It can be a process for forming an oxide layer in an ambient environment using TEOS. It can also be a process to form a polysilicon layer with silane. In any of these non-limiting examples, a residual chemical compound will remain in the chamber after the film is formed.

According to the invention, after the main film-forming process is completed, a short period of low power plasma-activated process is imposed for a sufficient time to remove residual chemical compounds generated in the aforesaid main process (processing deposition). As a result, the in-film particle number of the wafer product is reduced.

The step 110 includes flowing a carrier gas, such as one containing helium and nitrogen, with reaction gases, such as $NH_3$ or $O_2$, $N_2O$ or a combination thereof into the reaction chamber. The flow rates, of the carrier gases, for example helium or the nitrogen gases are about 500 sccm to about 3000 sccm; and about 50 sccm to about 3000 sccm, respectively. The reaction gas used in the process depends on what layer needs to be formed. For example, the reaction gas used for PE-silane or PETEOS is oxygen, the reaction gas used for forming silicon nitride is $NH_3$. The $N_2O$ is used for depositing PE-silane or an oxynitride layer. The flow rate of the reaction gas is about 50 to about 100% of the main film-forming process Next, in step 120, plasma power is reduced slowly over a period of about 2 to about 15 seconds, by about 5 to about 50% from the film-forming power; preferably about 10 to about 20% of the film-forming source. Thus, power is from about 50 to about 300 watt, preferably about 100 to about 150 watt. This allows the residual chemical compound to react with the reaction gases. Preferably, the pressure in the chamber is generally maintained at about 1 to about 5 torr.

Reduction in plasma power can be achieved by increasing gap spacing between the wafer and plasma generator used in the main process, at a constant power, or gradient power from about 5 to about 50% power of the main process. Alternatively, it can be obtained by keeping the same spacing as the main process but reducing the power source. The reduced plasma is applied for about 1 to about 15 seconds, preferably for about 2 to about 5 seconds. The pressure in the chamber is generally maintained at about 1 to about 5 torr. The temperature in this step is generally about 300 to about 450 degrees centigrade.

In step 130, a pump system is continuously on for pumping out the reacted chemical compound from the reaction chamber while maintaining the reduced plasma power if necessary. The pumping rate in the step is about 0.1 to about 2 torr/sec. However, it is to be understood that power levels are dependent on the process and the size of the substrate and equipment used to process the substrate. The process describe is used to advantage in a 200 mm substrate process performed in a standard centura DxZ chamber, available from AMAT.

It is believed, without being bound by theory, that the reduced plasma provides an energy source, and the reaction gas acts as a scavenger. Regardless of theory, it is observed that in-film particle number is dramatically reduced by this method. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for reducing particles derived from chemical residue formed within a chamber, comprising:

performing a chemical reaction by first flowing reaction gases at a first rate and by forming plasma power in the reaction chamber;

flowing reaction gases into the chamber at a second rate, wherein the second rate is about 50% to 100% of the first rate;

flowing a carrier gas into the chamber simultaneously with the step of flowing the reaction gases;

reducing the plasma power;

maintaining the reduced plasma power for a period of time sufficient to allow the chemical residue to react with the reaction gases; and pumping out the reacted chemical residue at a rate of about 0.1 to about 2 torr/sec. simultaneously with the maintaining step.

2. The method of claim 1, wherein the reduced plasma power is maintained for about 1 to about 15 seconds.

3. The method of claim 2, wherein the reduced plasma power is maintained for about 2 to about 5 seconds.

4. The method of claim 1, wherein the reduced plasma power is about 5% to about 50% of the power used for the chemical reaction.

5. The method of claim 4, wherein the reduced plasma power is about 10% to about 20% of the power used for the chemical reaction.

6. The method of claim 1, wherein the plasma power is reduced by increasing a gap between the wafer and the plasma generator.

7. The method of claim 1, wherein the chemical reaction is performed to form a film.

8. A method for reducing particles derived from within a chamber, comprising:

performing a chemical reaction on a wafer by forming plasma power from a plasma generator in the chamber, whereby a chemical residue is formed in the chamber;

flowing reaction gases into the chamber to react with the chemical residue;

flowing a carrier gas into the chamber simultaneously with the step of flowing the reaction gases;

reducing the plasma power;

maintaining the reduced plasma power for a period of time sufficient to allow the chemical residue to react with the reaction gases; and pumping out the reacted chemical residue at a rate of about 0.1 to about 2 torr/sec. simultaneously with the maintaining step.

9. The method of claim 8, wherein the reduced plasma power is maintained for about 1 to about 15 seconds after the reducing step.

10. The method of claim 9, wherein the reduced power is maintained for about 2 to about 5 seconds.

11. The method of claim 8, wherein the reduced plasma power is about 5% to about 50% of the power used for the chemical reaction.

12. The method of claim 11, wherein the reduced power is about 10% to about 20% of the plasma power used for the chemical reaction.

13. The method of claim 8, wherein the plasma power is reduced by increasing a gap between the wafer and the plasma generator.

14. The method of claim 8, wherein the chemical reaction is performed to form a film.

15. A method for reducing particles derived from within a chamber, comprising:

forming a plasma power from a plasma generator to perform a chemical reaction on a wafer in the chamber;

reducing the plasma power, wherein the reduced power is about 5% to about 50% of the power used for the chemical reaction; and evacuating the chamber while maintaining the reduced plasma for about 1 to about 15 seconds.

16. The method of claim 15, wherein the chamber is evacuated by pumping at a rate of about 0.1 to about 2 torr/sec.

17. The method of claim 16, wherein the reduced power is maintained for about 2 to about 5 seconds.

18. The method of claim 15, wherein the reduced power is about 10% to about 20% of the power used for the chemical reaction.

19. The method of claim 15, wherein the plasma power is reduced by increasing a gap between the wafer and the plasma generator.

20. The method of claim 15, wherein the chemical reaction is performed to form a film.

* * * * *